INVENTOR
W. R. WANESKY
BY [signature]
ATTORNEY 3,666,588

METHOD OF RETAINING AND BONDING ARTICLES

William R. Wanesky, Wescosville, Pa., assignor to Western Electric Company, Incorporated, New York, N.Y.

Filed Jan. 26, 1970, Ser. No. 5,829
Int. Cl. B32b *31/26*
U.S. Cl. 156—155 9 Claims

ABSTRACT OF THE DISCLOSURE

Beam-lead integrated-circuit chips are held in desired locations on substrates through the use of high purity glycerol as an adhesive. The beam leads of the chip are precoated with glycerol and the chips are placed at a desired location. If the desired location is to be permanent the chip can be bonded with conventional thermocompression bonding technique and the glycerol will be evaporated leaving no undesirable residues. Thus, the glycerol does not interfere with the bonding.

If the location is to be temporary, extremely fragile chips can be removed by lifting the chip with a heated vacuum pickup. Contact of the chip with a heated pickup evaporates the glycerol and the chip comes away from the substrate quite readily. Less fragile chips can be removed without evaporation of the glycerol.

BACKGROUND OF THE INVENTION

Field of the invention

This invention relates to methods of holding workpieces in desired locations on a supporting member in such a way that the workpieces can be either bonded or readily removed from the supporting member. More particularly, the invention relates to the retention of semiconductor devices on a support with a film of glycerol.

Description of the prior art

Many schemes have been used to retain small electronic devices, such as beam-lead integrated-circuit chips, in desired arrays on substrates or as individual devices at desired locations on substrates. But most of these schemes have suffered from various shortcomings.

Waxes, for instance, have often been employed in such situations where device retention is to be of a temporary nature. Removal of the chips temporarily held by wax can be accomplished by applying a solvent to the substrate and the held chip to dissolve the wax. It is also known to use inorganic hydrated salts to accomplish retention of electronic devices and release the devices with a solvent as described in U.S. Patent 2,984,897, issued on May 23, 1961 to J. Godfrey. However, in applying solvents to dissolve solid retention media, one often disturbs the orientation or positioning of the device by the mechanical action of the solvent.

Waxes are only one example of solid-liquid systems which can be used to temporarily retain devices on substrates. Water has been used in situations where a controlled low temperature can be developed that will cause the water to form into ice and thus hold the devices in their desired locations. But systems, such as the ice-water system often need elaborate refrigeration equipment.

Thus, all of these solid-liquid systems are less than completely satisfactory.

Attempts have been made to use fluids at ambient temperatures as device retention media and depend only on the surface-tension related phenomena to retain electron devices in place. In most cases however, such attempts have been unsuccessful in achieving a retention system in which devices can be accurately located. The principal reason for a lack of success is that liquids have been applied to desired locations on substrates as droplets. Formation of droplets usually results in an excessive thickness of the liquid and consequently the very minute integrated circuit chips "float" around on the substrate thus precluding accurate positioning.

Another shortcoming of fluids is that most fluids have a relatively low vapor pressure and they evaporate rapidly leaving the chips free to move on the substrate on which they were located.

Another type of system used for retaining devices employs an elastomeric substance in solid form. Suction between the elastomeric substance and the devices is created when the devices are placed onto the surface thereof. However, such substances are relatively insoluble and removal of devices from the surface thereof can be accomplished only by forcibly pulling away the devices. In the case of some beam-lead integrated-circuit chips, the delicate leads can be bent during the pulling away when the suction forces are too high.

SUMMARY OF THE INVENTION

It is an object of the invention to provide a temporary retention system for fragile articles which is easily used and which leaves the articles free of undesirable residues.

It is another object of the invention to provide such a temporary retention system for small articles which employs an adhesive media which will evaporate at temperatures low enough to be tolerated by the articles without damage.

It is a further object of the invention to provide a system of retaining fragile articles at well defined locations on a liquid adhesive system wherein the liquid is thin enough that the articles do not move from their desired locations.

It is an even further object of the invention to employ the temporary retention system in a bonding operation wherein semiconductor chips are bonded to metallic patterns on substrates.

The foregoing and other objects are accomplished in accordance with the invention by employing glycerol as an adhesive medium to secure fragile articles to desired positions on a substrate. When the glycerol is used in a bonding process evaporation of the glycerol occurs during the bonding cycle leaving substantially no residues to interfere with bond integrity.

DETAILED DESCRIPTION OF THE DRAWINGS

Other objects and features of the present invention will be more readily understood from the following detailed description of specific embodiments thereof when read in conjunction with the appended drawings in which.

DETAILED DESCRIPTION

Illustratively, the invention is described in connection with temporarily retaining beam-lead integrated-circuit chips having delicate gold leads extending from silicon body portions. However, it is to be understood that this is only for purposes of explanation and that the invention has applicability to many types of situations where convenient handling and accurate positioning are required and delicate construction of the retained devices is involved.

Figure 1:
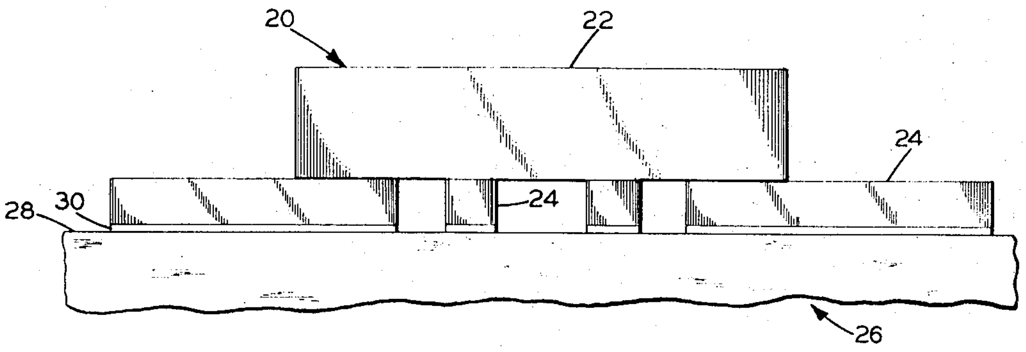
FIG. 1 is an elevational view of a beam-lead integrated-circuit chip retained on a substrate by a film of glycerol.

Referring now to FIG. 1, a beam-lead integrated-circuit chip is shown and designated generally by the numeral 20. The chip 20 is comprised of a silicon body portion 22 and gold leads 24. The chips 20 is shown being supported on a substrate, designated generally by the numeral 26 Between the leads 24 and the top surface 28 of the substrate 26 is a glycerol film 30 which is acting to hold the chip at a final location on the substrate. The glycerol film 30 must be sufficiently thin so that the chip 20 does not "float" around on the substrate 26. Such floating, of course, would result in inaccuracy of positioning.

Figure 2:
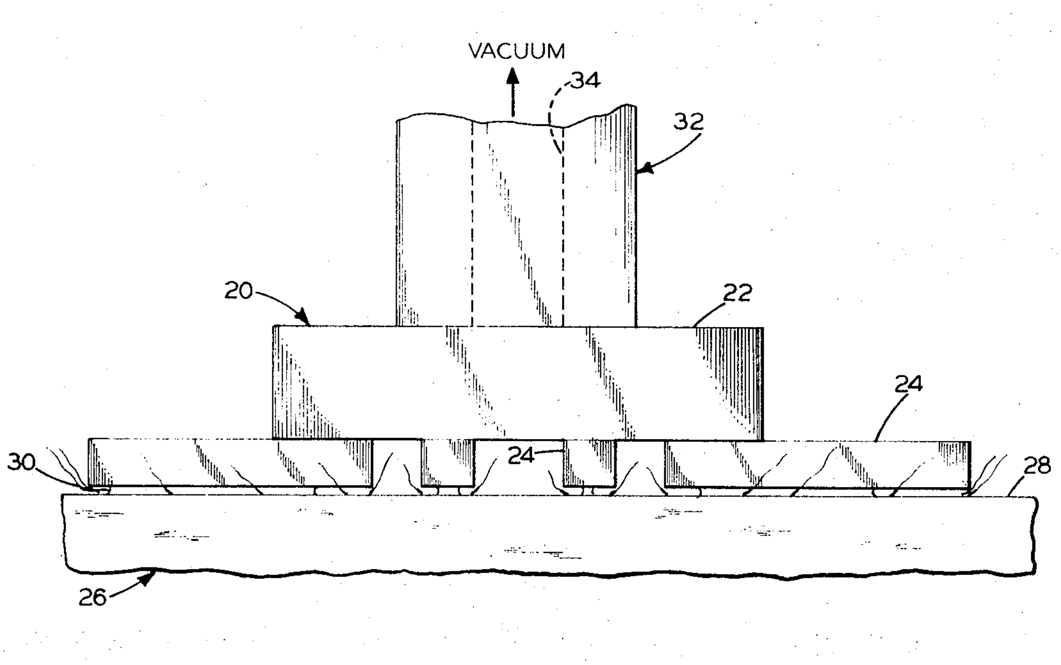
FIG. 2 is an elevational view of the chip of FIG. 1 being heated with a heated pickup tool.

FIG. 2 is representative of the phenomena which occurs when it is desired to remove the temporarily retained chip 20 from the substrate 26. A heated tip, designated generally by the numeral 32, is placed against the silicon body 22 of the chip 20. Vacuum is developed in a port 34. Heat from the tip 32 evaporates the glycerol film 30 under the leads 24 thus eliminating the adhesive forces between the leads 24 and the substrate 26. Such evaporation occurs quite readily at a temperature of 300° F.

Preferably, in order to reduce the probability of undesirable residues remaining after removal of the glycerol film 30, the glycerol is of spectrographic quality.

Figure 3:
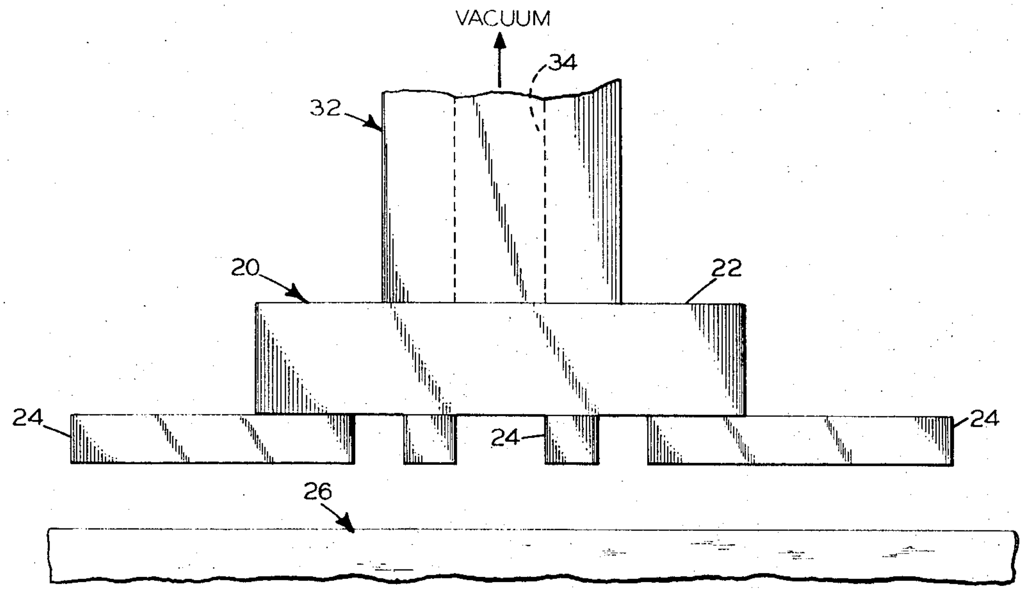
FIG. 3 is an elevational view of the chip of FIG. 1 being lifted after evaporation of the glycerol film.

After the glycerol film 30 adjacent the leads 24 is evaporated, the chip 20 can be readily lifted from the top surface 28 of the substrate 26, as shown in FIG. 3. The delicate leads 24 will not be distored or bent because they are not subjected to any adhesive force prior to their being lifted from the substrate 26. The lack of adhesive force also permits the use of extremely small vacuum pickups which generate only very small forces.

Because the glycerol is of such a high purity, probability of having residues and contaminants remaining on the leads 24 after evaporation of the glycerol is no greater than that which exists after having treated such an integrated-circuit chip with electronic grades of solvents such as trichloroethylene.

If the leads 24 are strong enough to tolerate the existence of the adhesive force of the glycerol film 30 while the chip 20 is being lifted and if larger pickups can be used it is possible to pick up the chips with an unheated tip. Gold leads which have a cross-sectional area of 0.002 x 0.0004 inch are usually free of distortion or bending when lifted prior to evaporation of the glycerol film 30.

Figure 4:
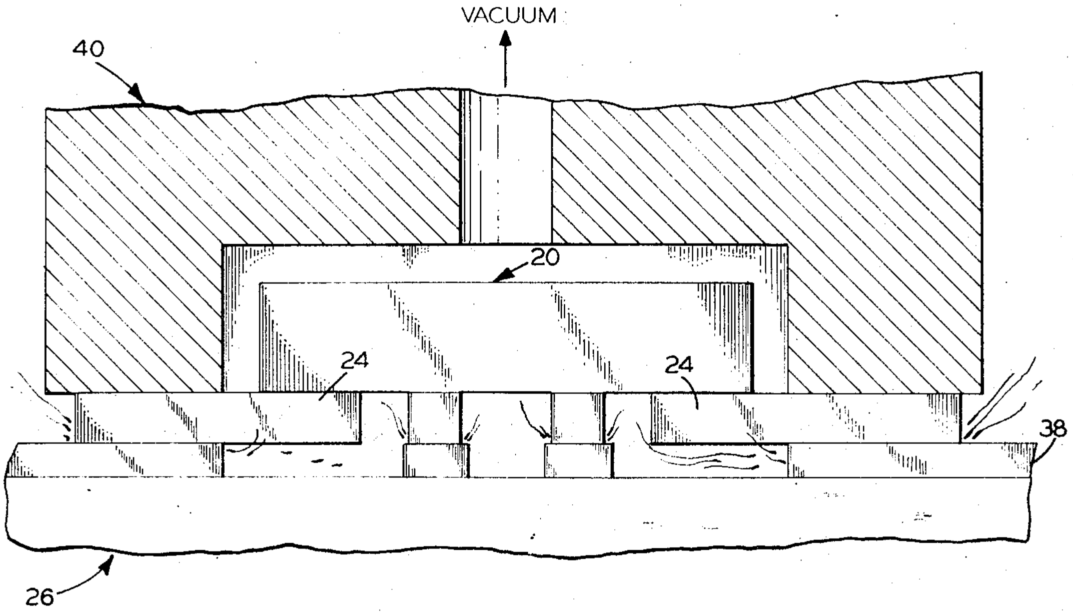
FIG. 4 is an elevational view of the chip of FIG. 1 being bonded to conductive elements by a heated bonding tool.

FIG. 4 represents a situation in which one of the chips 20 having glycerol on the leads 24 thereof has been placed on a metallic pattern 38 which has been formed on one of the substrates 26. A heated bonding tip, designated generally by the numeral 40, is placed over the leads 24 and a thermocompression bond is produced between the leads 24 and the metallic pattern 38. Bonding is performed at a temperature higher than 300° F. and, as a result, the glycerol film 30 is evaporated from the bond site leaving substantial no residues to interfere with the metallurgical system created by the bond.

As mentioned previously, the trickness of the glycerol film 30 of FIG. 1 is quite important to the proper functioning of the inventive device retention system. Various novel techniques for applying an appropriate thickness of glycerol to the leads 24 have been devised.

One way to apply glycerol to the leads 24 is by a "stamp pad" technique. The chip 20 is touched to a surface on which glycerol is present and glycerol is transferred to the leads 24 in the form of the film 30. However, a conventional "stamp pad" system which utilizes a soft and pliable pad is not entirely appropriate. If the surface yields, the beam leads will be bent upwardly. The undesirable bending can be prevented only by precise control on the pressure of application. Because of the delicate nature of the beam leads, control of pressure to a range which will coat the leads but still not bend them is impracticable.

Figures 5, 6, 7:
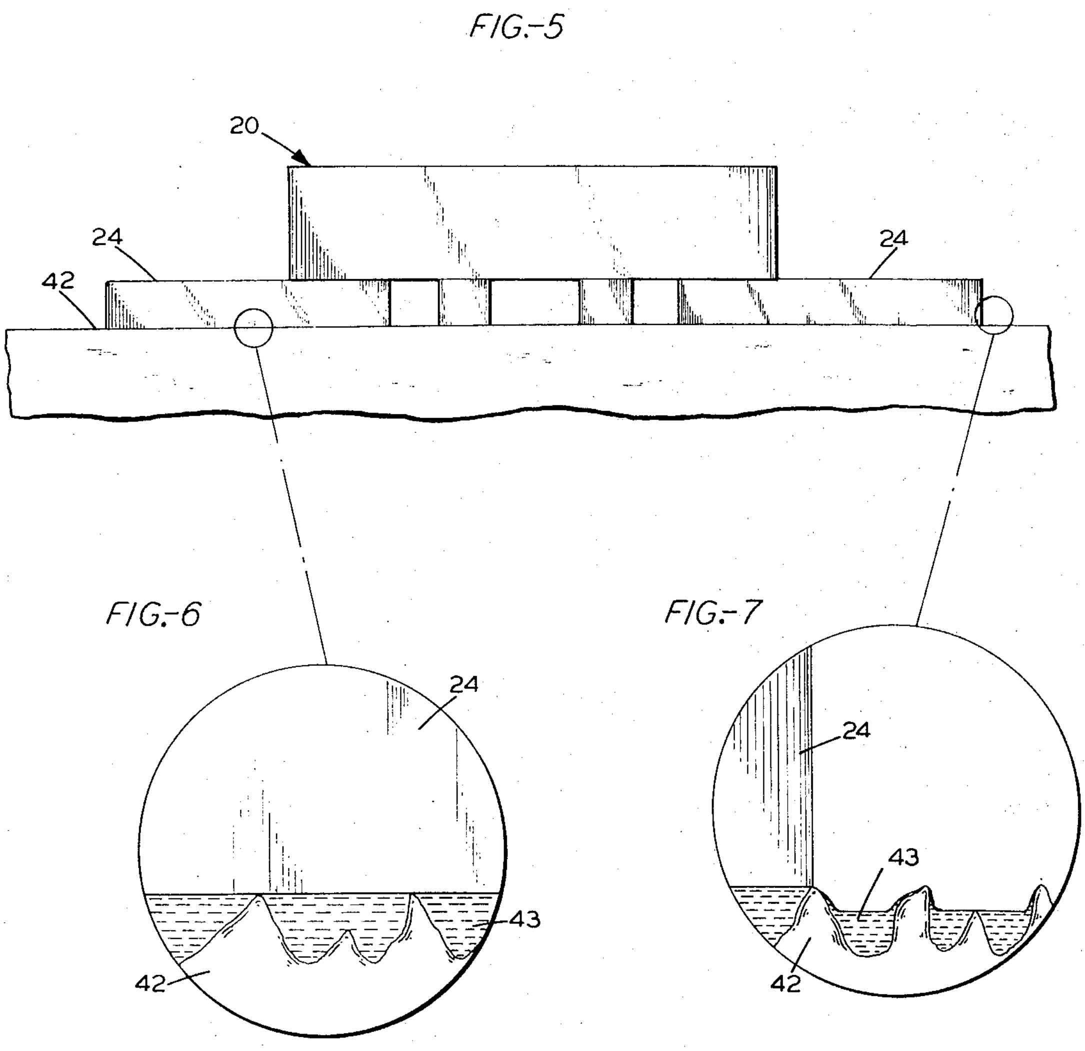
FIG. 5 is an elevational view of a chip in contact with a roughened substrate which is coated with glycerol.
FIG. 6 is an enlarged view of a portion of the surface of FIG. 5 showing the glycerol contacting leads of the chips.
FIG. 7 is an enlarged view of a portion of the surface of FIG. 5 showing the glycerol dispersed on the surface.

It has been discovered that a "stamp pad" system will work properly without undesirable bending of leads if a rigid "stamp pad" is used. FIG. 5 shows one instance of a rigid surface useful as a "stamp pad" for applying glycerol to the leads 24. A quartz disc 42 is coated with glycerol in a conventional spinning operation.

A highly polished disc of quartz will not operate satisfactorily because of the natural surface tension of the glycerol causes a formation of a pool of glycerol at the center of the smooth disc whenever any imperfection or blemish exists on the surface. Contact of one of the chips 20 with the pool will result in an excessive amount of glycerol being applied. A roughened surface finish however provides a distribution of blemishes which distribute the forces of surface tension and the undesirble pool of gliycerol does not form. It has been found that a surface finish of from 40 to 60 microinch per ASA standard B46-1-1955 is a suitably rough surface for successful dispersion of the glycerol.

FIG. 5 is a representation of the surface of the quartz disc 42 with various peaks and valleys as they would appear on a highly magnified view of a 50 micronich surface finish. It can be seen that a glycerol 43 coating is dispersed evenly across the surface of the discs 40. However, it can be seen that where one of the chips 20 is placed on the disc 42 the glycerol coating 43 under the leads 24 rises because of capillarly attraction to the undersurface of each of the leads 24. When the chip 20 is lifted from the disc 42 each of the leads 24 is left with the desired thin glycerol film 30 thereon. As each of chips 20 is placed on the disc 42 the formation of the film 30 of glycerol on the leads 24 is accomplished with great uniformity.

It is important to note, however, that the quartz disc 42 is provided with only a limited amount of glycerol on its surface. The glycerol coating 43 will be exhausted after an application of a number of the chips 20 to the disc 42, and the disc will require re-coating with glycerol.

Figure 8:
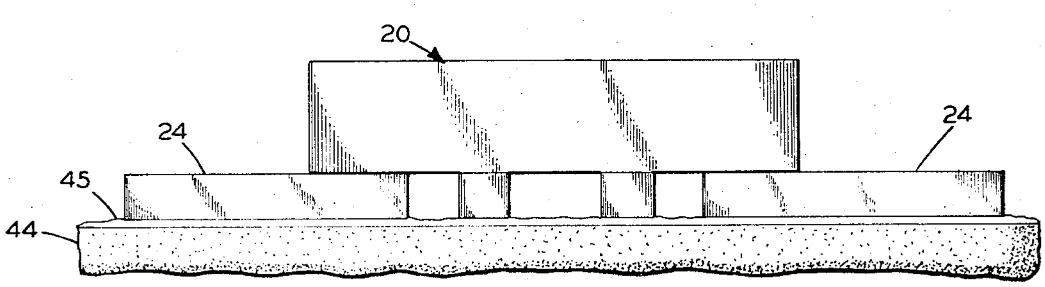
FIG. 8 is an elevational, partially sectioned view of a chip in contact with a porous material saturated with glycerol.

Rigid, porous materials are also useful for applying a controlled-thickness glycerol film 30 to the leads 24 as represented by a porous block 44 shown in FIG. 8.

One example of such a rigid porous material, is fine porosity fritted glass, available from Scientific Glass Apparatus of Bloomfield, N.J. as JF-1650 filter discs. Filled with glycerol, the pores act as reservoirs. A large number of the chips 20 can be applied to the surface of the block 44 without exhausting the supply of glycerol within the pores. Capillary forces continue to draw the glycerol through the pores to the contacting surface to form a coating 45. Glycerol from the pores replaces the glycerol drawn off from the surface by the application of successive ones of the chips 20.

The block 44 is impregnated with glycerol in a vacuum chamber (not shown). The pores of the block 44 are normally filled with air. Placement of the block 44 in a vacuum chamber (not shown) will evacuate the air from the pores. The block 44 is placed in the chamber in a container of glycerol (not shown) and after the air is withdrawn by the vacuum and atmospheric pressure is applied to the block the glycerol readily fills the evacuated pores.

If the porous block 44 is made from plastic material such as polyethylene which glycerol will not wet, it may be necessary to pre-soak the block with a low molecular weight alcohol such as ethanol or methanol and then permit the glycerol to enter the pores by diffusion through the lower weight alcohols.

An example of a plastic material useful in practicing the invention is a polyethylene filter material available from the Millipore Co. of Bedford, Mass. under the designation VCWP 04700 filters.

In using a porous material such as the block 44 to coat the leads 24, it is important to limit the period of time that one of the chips 20 is allowed to remain in contact with the surface of the block. Capillary forces will continue to draw glycerol out of the pores and eventually the leads 24 as well as the body portion 22 of the chip 20 will be completely covered with glycerol. The excessive glycerol will result in the undersirable "floating" of the chip 20 when placed on one of the substrates 26. The quartz disc 42 does not suffer from this disadvantage but the quartz disc requires re-coating with glycerol more often. Of course, the quartz disc can be used to store the chips 20 for indefinite periods of time.

Even though the glycerol which is holding the chips 20 to the substrates 26 has a low vapor pressure, the glycerol may in time evaporate at ambient temperature. If long term storage of the chips 20 secured to the substrate 26 is desired, it is advantageous to perform the storage in a controlled atmospheric environment of relatively high humidity. Ideally, a closed chamber in which an open container of glycerol is stored should be used. The atmosphere in the chamber soon becomes saturated with glycerol vapor and further evaporation of glycerol from the areas adjacent the leads 24 is stopped. Thus, the retention of the chips 20 in the desired location on the substrates 26 can be achieved for indefinite periods of time under these controlled storage conditions.

There are a number of areas in which the inventive retention system has utility.

It is often desirable to pre-locate a number of the chips on the metallic pattern of a substrate prior to a bonding operation (not shown). After pre-location is accomplished, a multiple bonding operation is performed on the particular substrate and a plurality of the chips are bonded simultaneously. The inventive system of device retention, with its inherent capability for accurate location, is very useful for the pre-location step in this application.

Another application, for which glycerol appears to be suitable, is in transferring devices from a mounting disc after ozone cleaning (not shown). In this application, polyester mesh stretched tightly in a fixture is coated with glycerol. The mesh is placed in contact with the loose chips on the mounting disc and then withdrawn with the chips held on the mesh by the surface tension of the glycerol. The chips are then clamped against a glass disc having a thin coating of silicone resin thereon and the glycerol is evaporated in an oven at 300° F. The mesh can then be withdrawn, leaving the chips on the silicone-resin coated disc.

Although certain embodiments of the invention have been shown in the drawings and described in the specification, it is to be understood that the invention is not limited thereto, is capable of modification, and can be arranged without departing from the spirit and scope of the invention.

What is claimed is:

1. A method of locating workpieces on a surface, which comprises the steps of:
- placing the workpieces in contact with a glycerol coated member;
- removing the workpiece from the glycerol coated member to transfer a film of the glycerol to the workpieces; and
- placing the portion of the workpieces having the glycerol film thereon in contact with the desired surface, whereby the workpiece is held to the surface by the forces developed by the glycerol film.

2. The method of locating of claim 1 wherein the member coated with glycerol is a rigid disc having a surface finish at least as rough as 40 microinch.

3. The method of locating of claim 1 wherein the member coated with glycerol is rigid and porous and the pores are filled with glycerol whereby the surface of the member is continuously supplied with glycerol reaching the surface by capillary forces.

4. A method of bonding a first workpiece to a second workpiece which comprises the steps of:
- placing the first workpiece in contact with a member coated with glycerol;
- removing the first workpiece from the glycerol coated member to transfer a film of the glycerol to the workpiece;
- placing the portion of the first workpiece having the glycerol film thereon in contact with a desired portion of the second workpiece whereby the workpieces are held together by the forces developed by the glycerol film;
- compressively engaging with the workpieces a bonding tool heated to a temperature high enough to cause rapid evaporation of glycerol whereby the glycerol is driven off as a gas during bonding and bonding is effected at a bond site substantially free of residues.

5. The method of bonding of claim 4 wherein the member coated with glycerol is a rigid disc having a surface finish at least as rough as 40 microinch.

6. The method of bonding of claim 4 wherein the member coated with glycerol is rigid and porous and the pores are filled with glycerol whereby the surface of the member is continuously supplied with glycerol reaching the surface by capillary forces.

7. The method of bonding of claim 4 wherein a plurality of the glycerol coated first workpieces are placed in a desired array on one of the second workpieces and bonding of all of the engaged workpieces is performed simultaneously.

8. A method of handling integrated-circuit chips having fragile beam leads extending therefrom, which comprises;
- coating the leads of the chips with glycerol;
- placing the coated leads in contact with a desired location on a substrate;
- contacting the chip with a heated pickup tool to evaporate the glycerol to facilitate removal of the chip from the substrate without any adhesive force operating to bend or distort the fragile leads.

9. The method of claim 8 wherein the coating of the leads is accomplished by placing the leads in contact with a member coated with glycerol to transfer a film of the glycerol to the leads.

References Cited

UNITED STATES PATENTS

| | | | |
|---|---|---|---|
| 3,429,717 | 2/1969 | Cook | 156—307 |
| 2,810,425 | 10/1957 | Heyman | 156—155 |
| 2,984,897 | 5/1961 | Godfrey | 156—155 |
| 2,986,671 | 5/1961 | Kerstetter et al. | 156—307 |
| 3,475,814 | 11/1969 | Santangini | 29—589 |

OTHER REFERENCES

Rose et al.: "The Condensed Chemical Dictionary," pp. 526–527 (5th ed.), Reinhold Publishing Corporation (1956), N.Y.

CARL D. QUARFORTH, Primary Examiner

E. A. MILLER, Assistant Examiner

U.S. Cl. X.R.

29—589; 156—299, 307